US008866020B2

(12) United States Patent
Ishii

(10) Patent No.: US 8,866,020 B2
(45) Date of Patent: Oct. 21, 2014

(54) METHOD FOR MANUFACTURING PRINTED CIRCUIT BOARD, METHOD FOR MANUFACTURING PRINTED CIRCUIT BOARD ASSEMBLY SHEET, PRINTED CIRCUIT BOARD, AND PRINTED CIRCUIT BOARD ASSEMBLY SHEET

(75) Inventor: Jun Ishii, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 316 days.

(21) Appl. No.: 13/298,741

(22) Filed: Nov. 17, 2011

(65) Prior Publication Data

US 2012/0152592 A1 Jun. 21, 2012

Related U.S. Application Data

(60) Provisional application No. 61/431,590, filed on Jan. 11, 2011.

(30) Foreign Application Priority Data

Dec. 20, 2010 (JP) ................................. 2010-282586

(51) Int. Cl.
| H05K 1/00 | (2006.01) |
| H05K 1/05 | (2006.01) |
| H05K 1/02 | (2006.01) |
| H05K 3/00 | (2006.01) |

(52) U.S. Cl.
CPC .............. H05K 1/056 (2013.01); H05K 3/0097 (2013.01); H05K 1/0268 (2013.01)
USPC ........... 174/250; 174/255; 174/254; 361/752; 361/767

(58) Field of Classification Search
CPC ....... H05K 1/056; H05K 1/00; H05K 1/0269; H05K 1/0268; H05K 1/14; H05K 3/0097; H05K 3/225; H05K 3/0052; H05K 3/0008; H05K 2201/09127; H05K 2201/0909; G11B 5/486
See application file for complete search history.

(56) References Cited

U.S. PATENT DOCUMENTS 6,106,688 A * 8/2000 Miyazaki et al. ............. 205/129
2004/0016116 A1* 1/2004 Yeh et al. ....................... 29/847
(Continued)

FOREIGN PATENT DOCUMENTS

JP 51-009684 A 1/1976
JP 62-085485 A 4/1987
(Continued)

OTHER PUBLICATIONS

Office Action issued Apr. 16, 2013 in JP Application No. 2010-282586.

*Primary Examiner* — Tuan T Dinh
*Assistant Examiner* — Steven T Sawyer
(74) *Attorney, Agent, or Firm* — Panitch Schwarze Belisario & Nadel LLP

(57) ABSTRACT

Base insulating layers are formed on a support substrate having a conductive property. The support substrate is etched, to form support substrate board and a plurality of conductive portions in a suspension board. The holding piece and the conductive portions constitute a shape determination unit. The conductive portions have first to fifth conductive portions. The third and fourth conductive portions are spaced apart from each other, and the fifth conductive portion is formed between the third and fourth conductive portions. The first and second conductive portions are respectively formed integrally with one end and the other end of the fifth conductive portion. It is determined whether the first and second conductive portions in the shape determination unit are connected electrically to each other. And it is determined whether the first and third conductive portions are connected electrically to each other.

2 Claims, 12 Drawing Sheets

(56) References Cited

U.S. PATENT DOCUMENTS

| | | | |
|---|---|---|---|
| 2006/0042822 A1* | 3/2006 | Azeyanagi et al. | 174/250 |
| 2006/0169486 A1* | 8/2006 | Funada et al. | 174/254 |
| 2007/0045790 A1* | 3/2007 | Ishizaka | 257/668 |
| 2007/0170911 A1* | 7/2007 | Ohsawa et al. | 324/158.1 |
| 2007/0241764 A1* | 10/2007 | Naito et al. | 324/754 |
| 2008/0134500 A1* | 6/2008 | Ishii et al. | 29/831 |
| 2011/0131806 A1* | 6/2011 | Ikawa | 29/846 |

FOREIGN PATENT DOCUMENTS

| | | |
|---|---|---|
| JP | 05-013922 A | 1/1993 |
| JP | 2005-123228 A | 5/2005 |
| JP | 2007-109725 A | 4/2007 |
| JP | 2007-115828 A | 5/2007 |
| JP | 2009-182242 A | 8/2009 |

* cited by examiner

METHOD FOR MANUFACTURING PRINTED CIRCUIT BOARD, METHOD FOR MANUFACTURING PRINTED CIRCUIT BOARD ASSEMBLY SHEET, PRINTED CIRCUIT BOARD, AND PRINTED CIRCUIT BOARD ASSEMBLY SHEET

BACKGROUND OF THE INVENTION (1) Field of the Invention

The present invention relates to a method for manufacturing a printed circuit board, a method for manufacturing a printed circuit board assembly sheet, a printed circuit board, and printed circuit board assembly sheet.

(2) Description of Related Art

Actuators are used in drives such as hard disk drives. Such an actuator includes an arm provided rotatably around a rotation shaft, and a suspension board with a circuit for a magnetic head that is attached to the arm. The suspension board with a circuit is a printed circuit board for positioning the magnetic head at a desired track of a magnetic disk.

In processes for manufacturing such a suspension board with a circuit, a plurality of assembly sheets each including suspension boards with circuits (hereinafter abbreviated as assembly sheets) are formed on a support substrate made of a metal. The support substrate is cut so that the assembly sheets are separated from one another. A plurality of suspension boards with circuits are aligned within a rectangular support frame in each of the assembly sheets (see, e.g., JP 2007-115828 A). Finally, each of the suspension boards with circuits is separated from the assembly sheet.

In processes for manufacturing the suspension boards with circuits discussed in JP 2007-115828 A, it is determined whether each of the suspension boards with circuits is a nondefective product or a defective product in the form of the assembly sheet.

In order to determine whether each of the suspension boards with circuits is a non-defective product or a defective product, an inspector performs visual inspection, for example. In the visual inspection, if an abnormality exists in shapes of some of the plurality of suspension boards with circuits provided in the assembly sheet, the inspector can easily distinguish between the normal suspension board with a circuit and the abnormal suspension board with a circuit. Therefore, the inspector can relatively easily determine the suspension boards with circuits in which an abnormality exists as defective products.

If a common abnormality occurs in shapes of all the suspension boards with circuits provided in the assembly sheet, however, it is difficult for the inspector to determine all the suspension boards with circuits in the assembly sheet as defective products.

BRIEF SUMMARY OF THE INVENTION

An object of the present invention is to provide a method for manufacturing a printed circuit board capable of accurately and easily identifying whether a printed circuit board portion is proper or improper, a method for manufacturing a printed circuit board assembly sheet, a printed circuit board, and a printed circuit board assembly sheet.

(1) According to an aspect of the present invention, a method for manufacturing a printed circuit board includes the steps of respectively forming insulating layers on first and second regions of a support substrate having a conductive property while forming a wiring trace on the insulating layer on the first region, forming a printed circuit board portion in the first region of the support substrate while forming first and second conductive portions spaced apart from each other in the second region of the support substrate by etching the support substrate, and detecting a conductive state between the first conductive portion and the second conductive portion and a conductive state between first and second positions spaced apart from each other on the second conductive portion, to determine whether an amount of etching in the printed circuit board portion of the support substrate is proper or improper.

In the method for manufacturing the printed circuit board, the insulating layers are respectively formed on the first and second regions of the support substrate having a conductive property, and the wiring trace is formed on the insulating layer on the first region. The support substrate is etched so that the printed circuit board portion is formed in the first region of the support substrate while the first and second conductive portions spaced apart from each other are formed in the second region of the support substrate.

Then, the conductive state between the first and second conductive portions is detected. If the amount of etching of the support substrate is insufficient, an area between the first conductive portion and the second conductive portion is rendered conductive. Therefore, the conductive state between the first and second conductive portions is detected so that it can be determined whether the amount of etching of the support substrate is insufficient. The conductive state between the first and second positions spaced apart from each other on the second conductive portion is detected. If the amount of etching of the support substrate is excessive, both ends of the second conductive portion are spaced apart from each other. Thus, an area between the first position and the second position of the second conductive portion is not rendered conductive. Therefore, the conductive state between the first and second positions of the second conductive portion is detected so that it can be determined whether the amount of etching of the support substrate is excessive.

It can be determined whether the amount of etching of the support substrate in the first region is proper or improper based on determination results the conductive states. As a result, it can be accurately and easily identified whether the printed circuit board portion is proper or improper.

(2) The second conductive portion may have a portion having a minimum width between the first position and the second position, and each of a minimum distance between the first conductive portion and the second conductive portion and the minimum width of the second conductive portion may be set to a minimum value of the amount of etching in which defective etching is determined to occur.

If the amount of etching of the support substrate is insufficient, the area between the first conductive portion and the second conductive portion at the minimum distance is rendered conductive. Therefore, the minimum distance between the first conductive portion and the second conductive portion is set to the minimum value of the amount of etching in which defective etching is determined to occur so that it can be accurately determined whether the amount of etching of the support substrate is insufficient. If the amount of etching of the support substrate is excessive, both the ends of the second conductive portion are separated from each other in the portion having the minimum width between the first position and the second position of the second conductive portion. Thus, the area between the first and second positions of the second conductive portion is not rendered conductive. Therefore, the minimum width between the first and second positions of the second conductive portion is set to the minimum value of the amount of etching in which defective etching is determined to occur so that it can be accurately determined whether the amount of etching of the support substrate is excessive. From these results, it can be more accurately identified whether the printed circuit board portion is proper or improper.

(3) The second region may be provided outside the first region. In this case, the printed circuit board portion need not be provided with the first conduction portion and the second conduction portion for determining whether the amount of etching is proper or improper. Therefore, a formation region of the wiring trace can be enlarged inside the first region.

(4) The second region may be provided inside the first region. In this case, the amount of etching of the support substrate in the first region and the amount of etching of the support substrate in the second region more accurately match each other. Therefore, the conductive state between first conductive portion and the second conductive portion in the second region and the conductive state between the first and second positions spaced apart from each other on the second conductive portion in the second region are detected so that it can be more accurately identified whether the printed circuit board portion in the first region is proper or improper.

(5) According to another aspect of the present invention, a method for manufacturing a printed circuit board assembly sheet having a plurality of printed circuit boards integrally provided therein includes the steps of respectively forming insulating layers on a plurality of first regions and a second region of a support substrate having a conductive property, respectively forming a plurality of wiring traces on the insulating layers on the plurality of first regions, respectively forming a plurality of printed circuit board portions in the plurality of first regions of the support substrate while forming first and second conductive portions spaced apart from each other in the second region of the support substrate by etching the support substrate, and detecting a conductive state between the first conductive portion and the second conductive portion and a conductive state between first and second positions spaced apart from each other on the second conductive portion, to determine whether an amount of etching in the plurality of printed circuit board portions of the support substrate is proper or improper.

In the method for manufacturing the printed circuit board assembly sheet, the insulating layers are respectively formed on the plurality of first regions and the second region of the support substrate having a conductive property, and the plurality of wiring traces are respectively formed on the insulating layers on the plurality of first regions. The support substrate is etched so that the plurality of printed circuit board portions are respectively formed in the plurality of first regions of the support substrate while the first and second conductive portions spaced apart from each other are formed in the second region of the support substrate.

Then, the conductive state between the first and second conductive portions is detected. If the amount of etching of the support substrate is insufficient, an area between the first conductive portion and the second conductive portion is rendered conductive. Therefore, the conductive state between the first and second conductive portions is detected so that it can be determined whether the amount of etching of the support substrate is insufficient. The conductive state between the first and second positions spaced apart from each other on the second conductive portion is detected. If the amount of etching of the support substrate is excessive, both ends of the second conductive portion are separated from each other. Thus, an area between the first and second positions of the second conductive portion is not rendered conductive. Therefore, the conductive state between the first and second positions of the second conductive portion is detected so that it can be determined whether the amount of etching of the support substrate is excessive.

It can be determined whether the amount of etching of the support substrate in the plurality of first regions is proper or improper based on determination results of the conductive states. As a result, even if defective etching occurs so that a common abnormality occurs in the shapes of the plurality of printed circuit board portions, it can be accurately and easily identified whether the plurality of printed circuit board portions are proper or improper.

(6) According to still another aspect of the present invention, a printed circuit board includes a support substrate having a conductive property, insulating layers respectively formed on first and second regions of the support substrate, and a wiring trace formed on the insulating layer on the first region, in which the first region of the support substrate is processed into a printed circuit board portion, and the second region of the support substrate is processed into first and second conductive portions spaced apart from each other.

In the printed circuit board, the insulating layers are respectively formed on the first and second regions of the support substrate having a conductive property, and the wiring trace is formed on the insulating layer on the first region. The first region of the support substrate is processed into the printed circuit board portion, and the second region of the support substrate is processed into the first and second conductive portions spaced apart from each other.

If the first and second conductive portions are not processed to be spaced apart from each other, an area between the first conductive portion and the second conductive portion is rendered conductive. Therefore, a conductive state between the first and second conductive portions is detected so that it can be determined whether the first and second conductive portions are spaced apart from each other. If the second conductive portion is not integrally processed, and both ends of the second conductive portion are separated from each other, an area between the one end and the other end of the second conductive portion is not rendered conductive. Therefore, a conductive state between the one end and the other end of the second conductive portion is detected so that it can be determined whether the second conductive portion is integrally processed.

It can be determined whether the first and second conductive portions are accurately processed based on these determination results. As a result, it can be accurately and easily identified whether the printed circuit board portion is proper or improper.

(7) According to yet still another aspect of the present invention, a printed circuit board assembly sheet having a plurality of printed circuit boards integrally provided therein includes a support substrate having a conductive property, insulating layers respectively formed on a plurality of first regions and a second region of the support substrate, and a plurality of wiring traces respectively formed on the insulating layers on the plurality of first regions, in which the plurality of first regions of the support substrate are respectively processed into a plurality of printed circuit board portions, and the second region of the support substrate is processed into first and second conductive portions spaced apart from each other.

In the printed circuit board assembly sheet, the insulating layers are respectively formed on the plurality of first regions and the second region of the support substrate having a conductive property, and the plurality of wiring traces are respectively formed on the insulating layers on the plurality of first regions. The plurality of first regions of the support substrate are respectively processed into the plurality of printed circuit board portions, and the second region of the support substrate is processed into the first and second conductive portions spaced apart from each other.

If the first and second conductive portions are not processed to be spaced apart from each other, an area between the first conductive portion and the second conductive portion is rendered conductive. Therefore, a conductive state between the first and second conductive portions is detected so that it can be determined whether the first and second conductive portions are spaced apart from each other. If the second conductive portion is not integrally processed, and both ends of the second conductive portion are separated from each other, an area between the one end and the other end of the second conductive portion is not rendered conductive. Therefore, a conductive state between the one end and the other end of the second conductive portion is detected so that it can be determined whether the second conductive portion is integrally processed.

It can be determined whether the first and second conductive portions are accurately processed based on these determination results. As a result, even if a common abnormality occurs in shapes of the plurality of printed circuit board portions, it can be accurately and easily identified whether the plurality of printed circuit board portions are proper or improper.

Other features, elements, characteristics, and advantages of the present invention will become more apparent from the following description of preferred embodiments of the present invention with reference to the attached drawings.

DESCRIPTION OF THE PREFERRED EMBODIMENTS

A method for manufacturing a printed circuit board according to an embodiment of the present invention, a method for manufacturing a printed circuit board assembly sheet, a printed circuit board, and a printed circuit board assembly sheet will be described with reference to the drawings. In the present embodiment, an assembly sheet including suspension boards with circuits (hereinafter referred to as an assembly sheet) will be described as examples of a printed circuit board and a printed circuit board assembly sheet.

(1) Assembly Sheet

Figure 1:
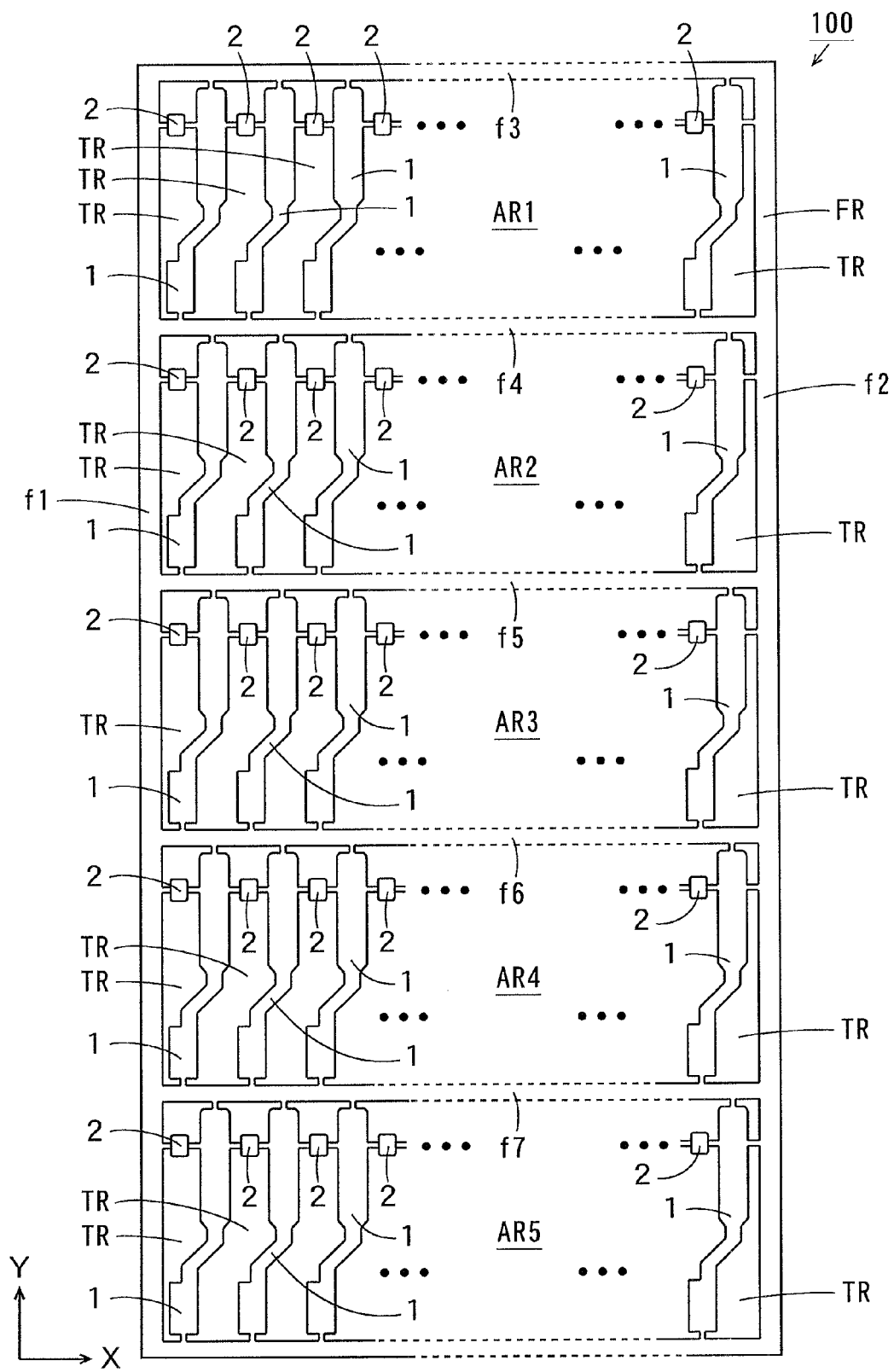
FIG. 1 is a top view of an assembly sheet according to an embodiment of the present invention.
Figure 2:
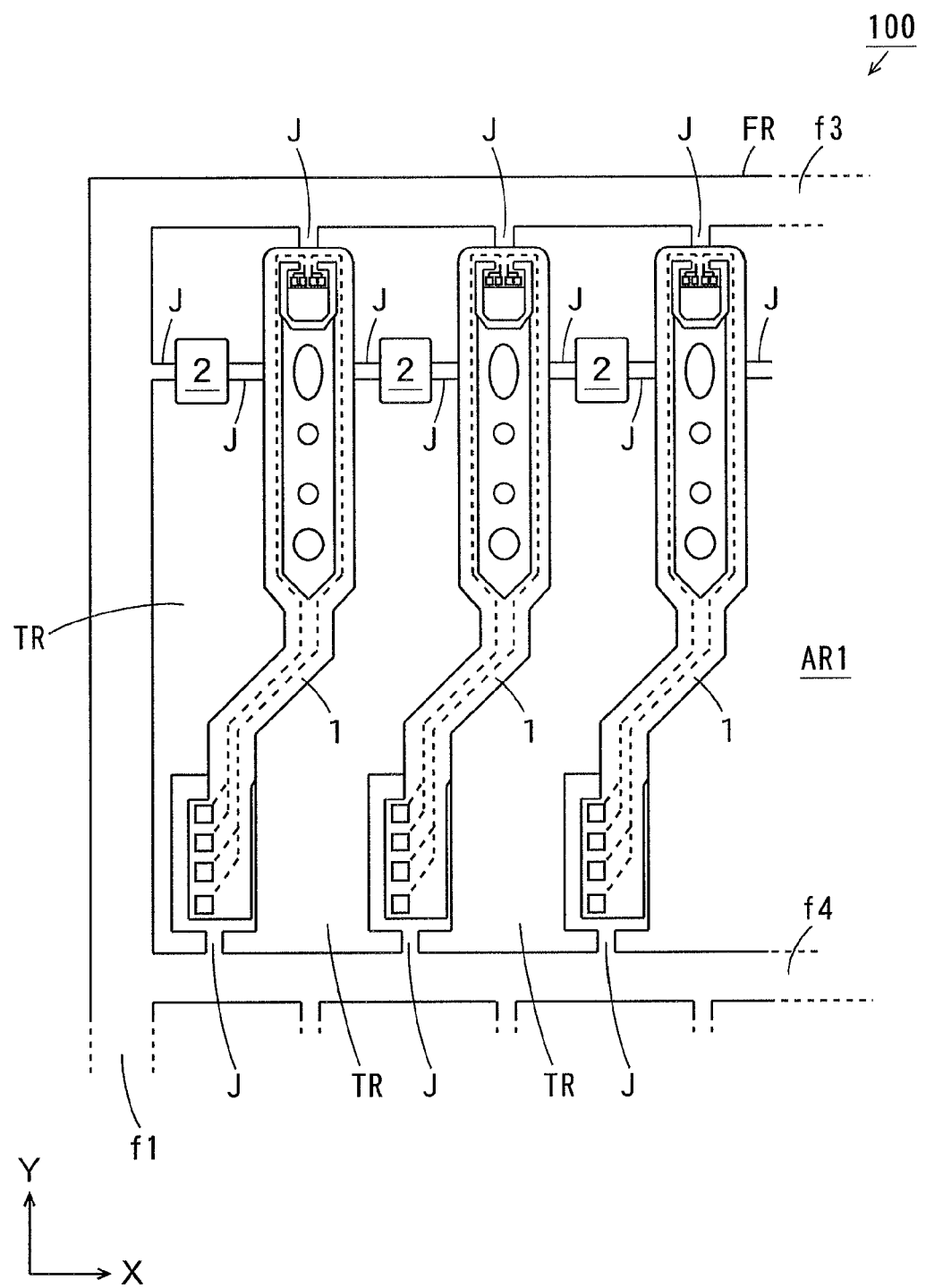
FIG. 2 is a partially enlarged top view of the assembly sheet illustrated in FIG. 1.

FIG. 1 is a top view of an assembly sheet 100 according to an embodiment of the present invention. FIG. 2 is a partially enlarged top view of the assembly sheet 100 illustrated in FIG. 1. The assembly sheet 100 is a half-finished product in manufacturing processes of suspension boards with circuits (hereinafter referred to as suspension boards), and is formed of a long-sized support substrate made of a metal. A method for manufacturing the assembly sheet 100 will be described below. In FIGS. 1 and 2, and FIGS. 3, 4, 8, 9, and 10, described below, two directions perpendicular to each other are defined as an X direction and a Y direction, as indicated by arrows X and Y. In this example, the X direction and the Y direction are directions parallel to a horizontal plane.

The assembly sheet 100 has a rectangular outer shape, and includes a support frame FR, a plurality of long-sized suspension boards 1, and a plurality of shape determination units 2. The support frame FR includes a pair of side frames f1 and f2 and a plurality of end frames f3, f4, f5, f6, and f7.

The side frames f1 and f2 are opposed to each other while extending in the Y direction. The end frames f3 to f7 extend in the X direction perpendicular to the pair of side frames f1 and f2, and are formed to connect the side frames f1 and f2. The end frames f3 to f7 are equally spaced in the Y direction from one end to the other end of the pair of side frames f1 and f2. Thus, a plurality of (five in this example) rectangular regions AR1, AR2, AR3, AR4, and AR5, which are defined by the side frames f1 and f2 and the end frames f3 to f7, are formed in the support frame FR.

The plurality of suspension boards 1 are arranged in the X direction in each of the rectangular regions AR1 to AR5. A separation groove TR is formed along an outer peripheral edge of each of the suspension boards 1. In the present embodiment, the plurality of shape determination units 2 respectively correspond to the plurality of suspension boards 1. Each of the shape determination units 2 is provided in the separation groove TR on one side of the corresponding suspension board 1.

As illustrated in FIG. 2, both ends of each of the suspension boards 1 are connected to the support frame FR via coupling portions J. In the suspension groove TR between the one side frame f1 and the suspension board 1 adjacent to the side frame f1, the shape determination unit 2 is connected to the side frame f1 and the suspension board 1, respectively, via two coupling portions J. In the suspension groove TR between the two adjacent suspension boards 1, the shape determination unit 2 is connected to the two suspension boards 1, respectively, via two coupling portions J. As described above, the plurality of shape determination units 2 respectively correspond to the plurality of suspension boards 1. Therefore, in the separation groove TR between the other side frame f2 and the suspension board 1 adjacent to the side frame f2, the shape determination unit 2 is not provided, as illustrated in FIG. 1.

The coupling portions J are cut in a final stage of the manufacturing processes so that each of the suspension boards 1 is separated from the support frame FR and the shape determination unit 2.

(2) Configurations of Suspension Board and Shape Determination Unit

Figure 3:
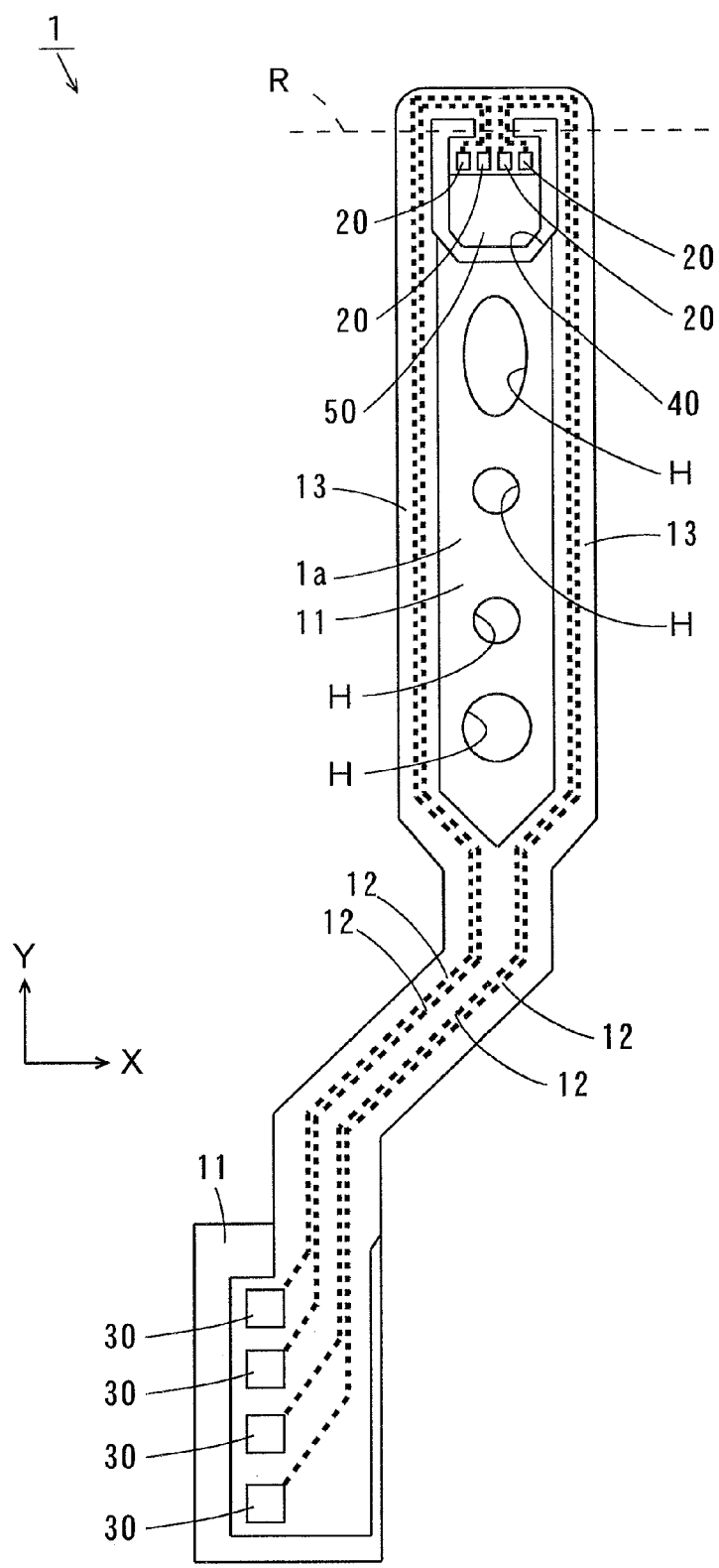
FIG. 3 is a top view of a suspension board.

FIG. 3 is a top view of the suspension board 1. As illustrated in FIG. 3, the suspension board 1 includes a suspension body 1a formed of a support substrate 10 (see FIG. 5) and a base insulating layer 11, described below. At a tip of the suspension body 1a, a U-shaped opening 40 is formed, thereby providing a magnetic head supporting portion (hereinafter referred to as a tongue) 50. The tongue 50 is bent along a broken line R to form a predetermined angle to the suspension body 1a.

Four electrode pads 20 are formed at an end of the tongue 50. Four electrode pads 30 are formed at the other end of the suspension body 1a. The four electrode pads 20 on the tongue 50 and the four electrode pads 30 at the other end of the suspension body 1a are electrically connected to each other via four linear conductor patterns 12 serving as wiring traces. A plurality of holes H are formed in the suspension body 1a. The four conductor patterns 12 are covered with a cover insulating layer 13. The four conductor patterns 12 constitute a wiring trace according to the present invention.

Figure 4:
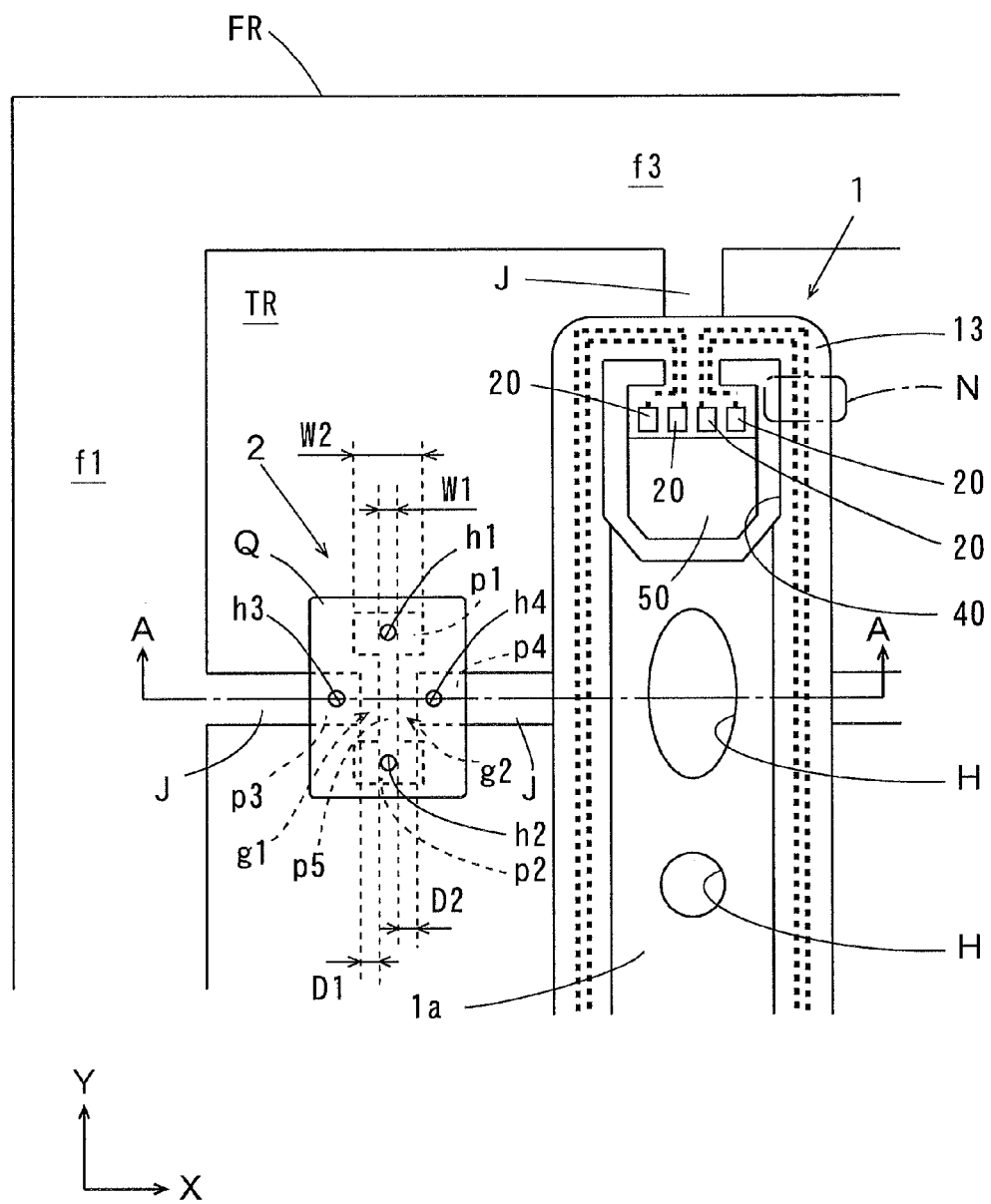
FIG. 4 is a top view of one shape determination unit and its peripheral portion in the assembly sheet illustrated in FIG. 1.
Figure 5:
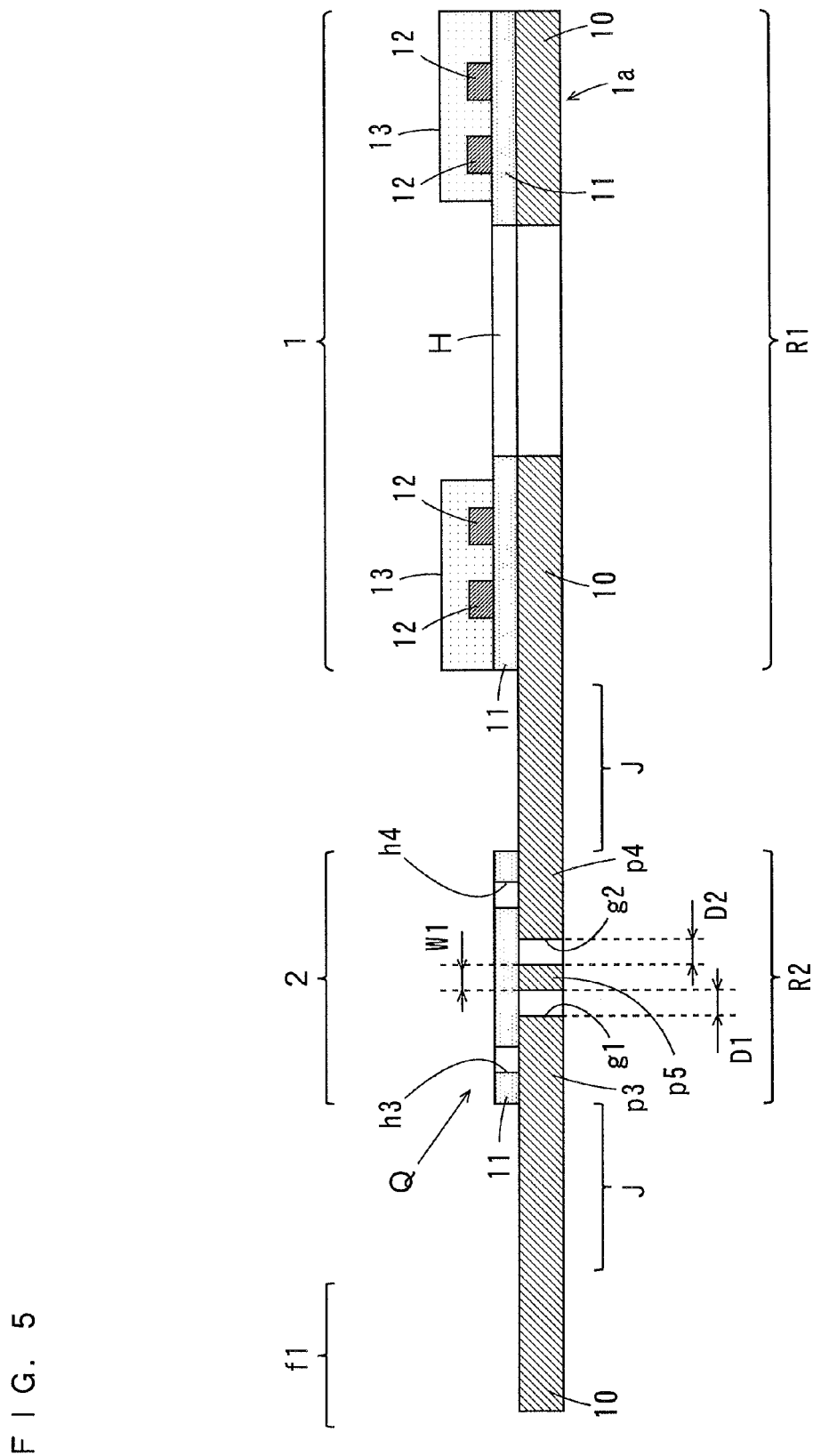
FIG. 5 is a sectional view taken along a line A-A illustrated in FIG. 4.

FIG. 4 is a top view of the one shape determination unit 2 and its peripheral portion in the assembly sheet 100 illustrated in FIG. 1. FIG. 4 is a top view mainly illustrating the shape determination unit 2 provided between the side frame f1 and the suspension board 1. FIG. 5 is a sectional view taken along a line A-A illustrated in FIG. 4. FIG. 5 mainly illustrates a cross section of the one suspension board 1 and the shape determination unit 2.

As illustrated in FIG. 5, the suspension board 1, the shape determination unit 2, the side frame f1, and the coupling portions J are formed of the support substrate 10 made of stainless steel. The suspension board 1 is formed in a first region R1, and the shape determination unit 2 is formed in a second region R2. The coupling portion J is formed to extend into the separation groove TR from the side frame f1. The connecting portion J is formed to extend into the separation groove TR from the suspension board 1.

The shape determination unit 2 is provided between the two coupling portions J respectively extending from the side frame f1 and the suspension board 1. The shape determination unit 2 includes a plurality of conductive portions P1, P2, P3, P4, and P5 and a holding piece Q having a rectangular shape, as illustrated in FIG. 4. The conductive portions p1 to p5 are formed by etching the support substrate 10 illustrated in FIG. 5. The holding piece Q is formed to cover the conductive portions p1 to p5 by etching a base insulating layer 11 illustrated in FIG. 5 formed on the support substrate 10.

The conductive portion p3 is formed integrally with the coupling portion J at a tip of the coupling portion J extending from the side frame f1, and the conductive portion p4 is formed integrally with the coupling portion J at a tip of the coupling portion J extending from the suspension board 1. In the X direction, the conductive portions p3 and p4 are spaced apart from each other.

The conductive portion p5 is formed to extend in the Y direction between the conductive portions p3 and p4. The conductive portions p1 and p2 are respectively formed integrally with the conductive portion p5 at the one end and the other end of the conductive portion p5. The width W1 of the conductive portion p5 in the X direction is determined to be smaller than the width W2 of the conductive portions p1 and p2. In the present embodiment, the conductive portion p5 has a constant width W1, and the conductive portions p1 and p2 have a constant width W2. If the conductive portion p5 does not have the constant width, the minimum value of the width of the conductive portion p5 is the width W1 of the conductive portion p5.

A gap g1 is provided between the conductive portion p5 and the conductive portion p3. The width D1 of the gap g1 in the X direction is determined to be equal to the width W1 of the conductive portion p5. Similarly, a gap g2 is provided between the conductive portion p5 and the conductive portion p4. The width D2 of the gap g2 in the X direction is determined to be equal to the width \N1 of the conductive portion p5. In the present embodiment, the gap g1 has a constant width D1. If the gap g1 does not have the constant width, the minimum value of the width of the gap g1 is the width D1 of the gap g1. The gap g2 has a constant width D2. If the gap g2 does not have the constant width, the minimum value of the width of the gap g2 is the width D2 of the gap g2.

As design dimensions, the width W1 of the conductive portion p5 illustrated in FIG. 4 is 50 μm, for example, preferably not less than 10 μm and not more than 100 μm, and more preferably not less than 10 μm and not more than 60 μm.

As design dimensions, the widths D1 and D2 of the gaps g1 and g2 are 50 μm, for example, preferably not less than 10 μm and not more than 100 μm, and more preferably not less than 10 μm and not more than 60 μm.

Four through holes h1, h2, h3, and h4 are respectively formed in portions of the holding piece Q, which respectively overlap central portions of the four conductive portions p1, p2, p3, and p4. As design dimensions, the inner diameter of each of the through holes h1, h2, h3, and h4 is 100 μm, for example, preferably not less than 30 μm and not more than 200 μm, and more preferably not less than 50 μm and not more than 100 μm.

In FIG. 5, in the first region R1 corresponding to the suspension board 1, the base insulating layer 11 made of polyimide is formed on the support substrate 10 made of stainless steel. Four conductor patterns 12 made of copper are formed on the base insulating layer 11. Further, cover insulating layers 13 made of polyimide are formed on the base insulating layer 11 to cover the four conductor patterns 12.

(3) Method for Manufacturing Assembly Sheet

Figure 6:
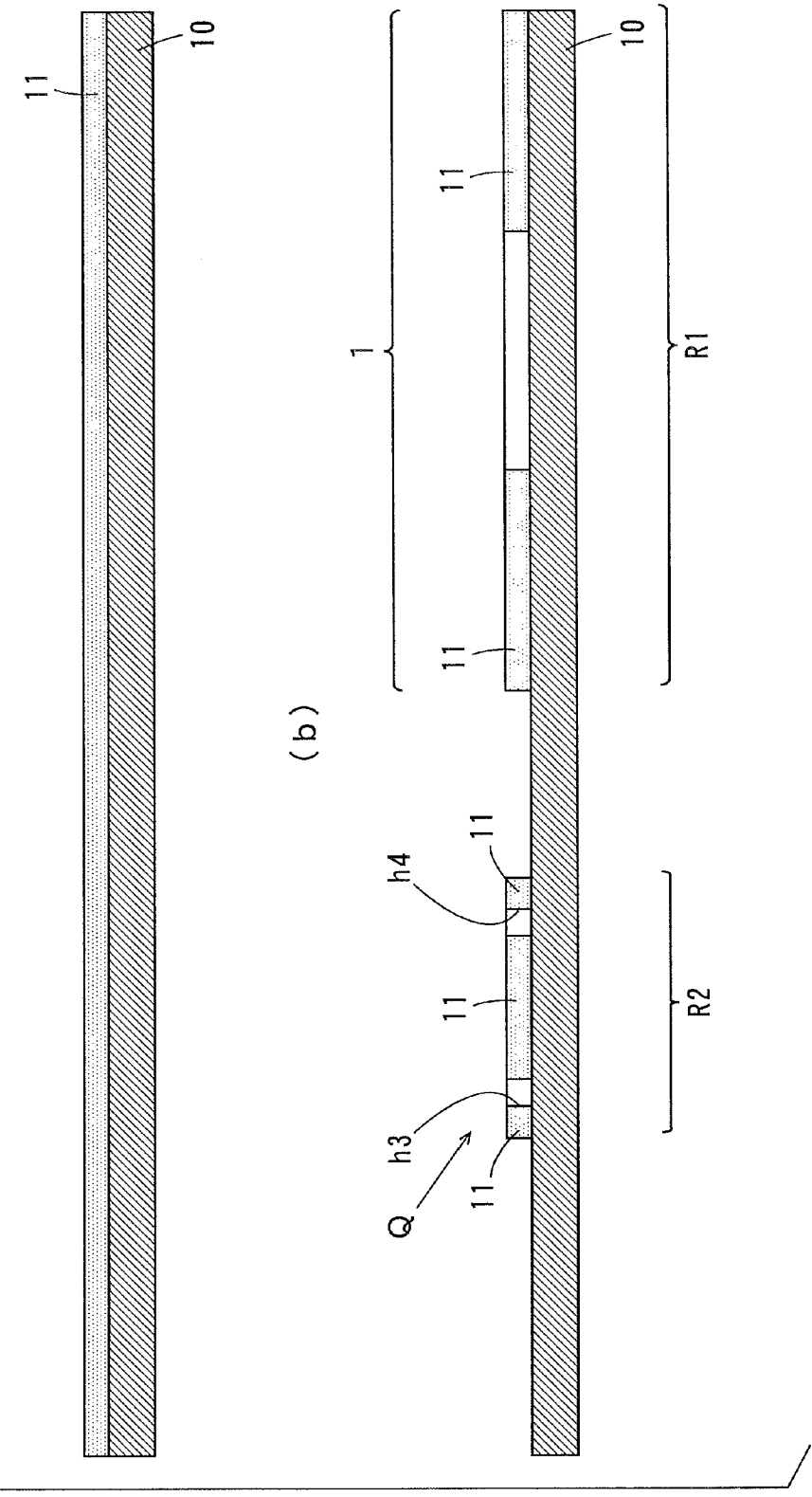
FIG. 6 is a sectional view illustrating steps in one example of a method for manufacturing the assembly sheet.
Figure 7:
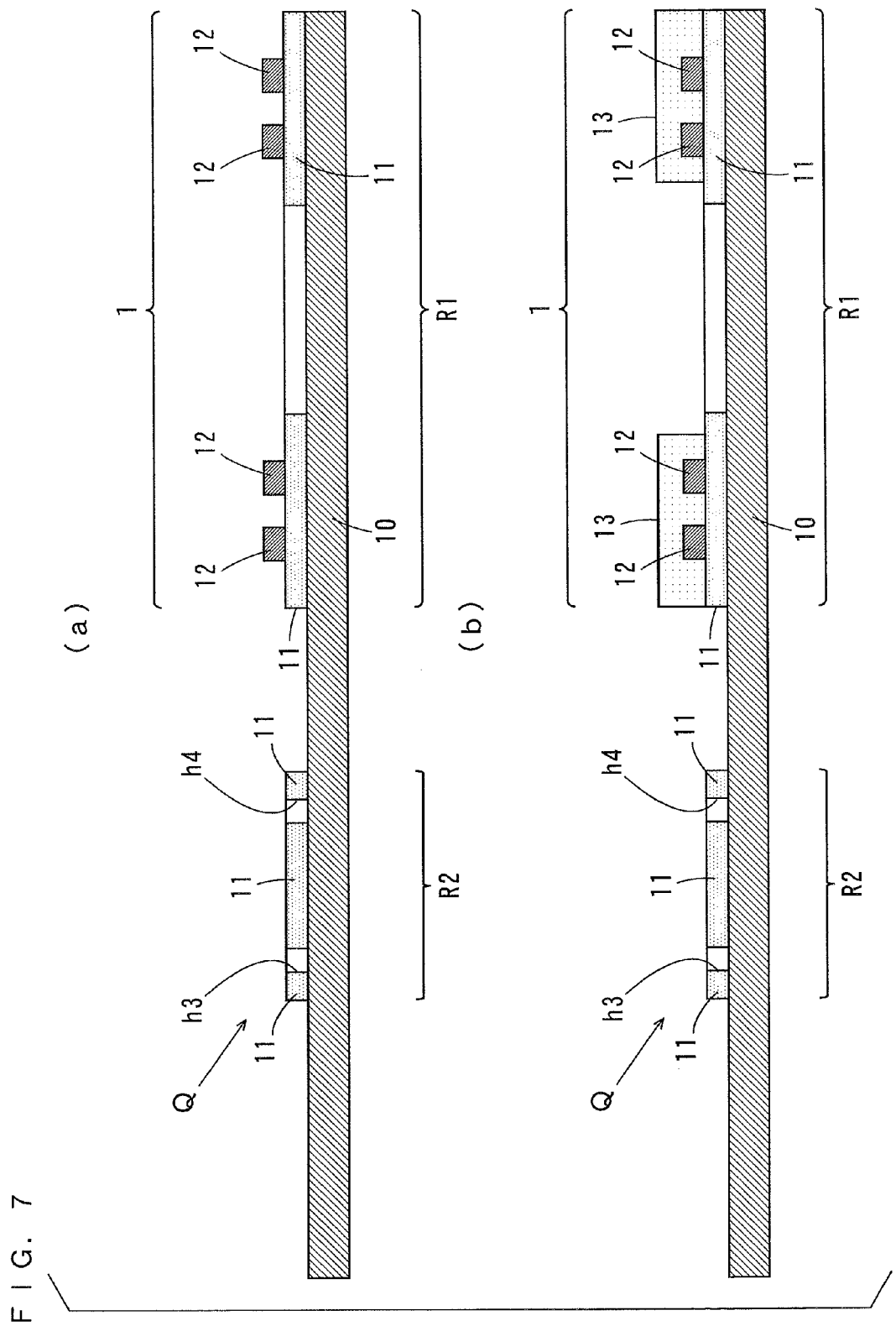
FIG. 7 is a sectional view illustrating steps in one example of a method for manufacturing the assembly sheet.

A method for manufacturing the assembly sheet 100 will be described below. FIGS. 6 (a) and 6 (b) and FIGS. 7 (a) and 7 (b) are sectional views illustrating steps in one example of the method for manufacturing the assembly sheet 100 according to the present embodiment. FIGS. 6 and 7 correspond to a cross section taken along the line A-A illustrated in FIG. 4.

First, the base insulating layer 11 made of polyimide is formed on the long-sized support substrate 10 made of stainless steel, as illustrated in FIG. 6 (a). A two-layer base material having a laminated structure of the support substrate 10 and the base insulating layer 11 may be used.

A material for the support substrate 10 is not limited to stainless steel. For example, another metal material such as aluminum (Al) may be used. The thickness of the support substrate 10 is not less than 10 μm and not more than 30 μm, for example, and preferably not less than 12 μm and not more than 20 μm. A material for the base insulating layer 11 is not limited to polyimide. For example, another resin material such as epoxy may be used. The thickness of the base insulating layer 11 is not less than 3 μm and not more than 20 μm, for example, and preferably not less than 5 μm and not more than 15 μm.

The base insulating layer 11 is then etched with an etching resist (not illustrated), thereby forming the base insulating layers 11 for the suspension board 1 and the base insulating layers 11 for the plurality of holding pieces Q on the support substrate 10, as illustrated in FIG. 6 (b).

The conductor patterns 12 are then formed on the base insulating layers 11 for the suspension board 1 by electrolytic plating, as illustrated in FIG. 7 (a). The conductor patterns 12 may be formed using an additive method, a semi-additive method, or another method such as a subtractive method.

A material for the conductor pattern 12 is not limited to copper. For example, another metal such as gold (Au) or aluminum or an alloy such as a copper alloy or an aluminum alloy may be used. The thickness of the conductor pattern 12 is not less than 3 µm and not more than 16 µm, for example, and preferably not less than 6 µm and not more than 13 µm. The width of the conductor pattern 12 is not less than 12 µm and not more than 60 µm, for example, and preferably not less than 16 µm and not more than 50 µm.

Further, the cover insulating layer 13 made of polyimide is formed on the support substrate 10 to cover the conductor patterns 12 and the base insulating layers 11, and is then etched with an etching resist (not illustrated). Thus, the cover insulating layers 13 are formed on the base insulating layers 11 for the suspension board 1 to cover the conductor patterns 12, as illustrated in FIG. 7 (b).

A material for the cover insulating layer 13 is not limited to polyimide. For example, another insulating material such as epoxy may be used. The thickness of the cover insulating layer 13 is not less than 3 µm and not more than 30 µm, for example, and preferably not less than 5 µm and not more than 10 µm.

The cover insulating layers 13 may be respectively formed on the base insulating layers 11 for the plurality of holding pieces Q in addition to being formed on the base insulating layers 11 for the suspension board 1. In this case, the cover insulating layer 13 on each of the holding pieces Q has similar through holes to through holes h1, h2, h3, and h4 in the holding piece Q respectively formed in its portions that overlap the through holes h1, h2, h3, and h4.

Regions, excluding regions of the suspension board 1, the support frame FR, the plurality of coupling portions J, and the plurality of conductive portions p1 to p5 illustrated in FIG. 4, of the support substrate 10 are then removed by etching, thereby forming the separation grooves TR, the opening 40, the holes H, and the gaps g1 and g2 illustrated in FIG. 4.

Finally, the support substrate 10 is cut, thereby separating the assembly sheets 100 from one another. Thus, the independent assembly sheets 100 are formed.

Inspection is performed for the manufactured assembly sheet 100 to detect an abnormality in its shape. In the present embodiment, the inspection for detecting the abnormality in the shape of the assembly sheet 100 includes visual inspection and conduction inspection of the support substrate 10 in the shape determination unit 2.

In the visual inspection, an inspector observes the appearance of the assembly sheet 100 using a microscope. Thus, it is determined whether an abnormality occurs in the shape of each of the suspension boards 1.

As described above, in the steps of manufacturing the assembly sheet 100, the support substrate 10 is processed to a predetermined shape by etching. Therefore, in an etching process of the support substrate 10, if the support substrate 10 is excessively etched or the support substrate 10 is not sufficiently etched, the support substrate 10 cannot be processed into a predetermined shape.

If the suspension board 1 includes a portion having a small width (hereinafter referred to as a narrow portion), as indicated by a one-dot and dash line N illustrated in FIG. 4, the support substrate 10 is excessively etched so that the width of the narrow portion is further reduced. In this case, sufficient rigidity of the suspension board 1 cannot be obtained. If the support substrate 10 is not sufficiently etched, the opening 40 illustrated in FIG. 4 is reduced. In this case, the tongue 50 is not accurately formed.

The support substrate 10 is etched under the same condition to manufacture the plurality of assembly sheets 100. In this case, when a common abnormality occurs in the shapes of all the suspension boards 1 provided in each of the assembly sheets 100, the visual inspection makes it difficult for the inspector to determine that abnormalities respectively occur in the shapes of all the suspension boards 1.

In order to determine whether etching is excessive and determine whether etching is insufficient, the conduction inspection of the support substrate 10 is performed to determine whether the error between a position of an outer edge of the support substrate 10 after the etching and a designed position of the outer edge of the support substrate 10 (hereinafter referred to as a designed position) is a value that is considered to be defective (hereinafter referred to as a defective error) or more.

In the conduction inspection of the support substrate 10, it is first determined whether the two conductive portions p1 and p2 in the shape determination unit 2 are electrically connected to each other. Second, it is determined whether at least one of the two conductive portions p1 and p2 in the shape determination unit 2 illustrated in FIG. 4 and at least one of the two conductive portions p3 and p4 in the shape determination unit 2 are electrically connected to each other.

A conduction inspection apparatus (not illustrated) including two inspection probes is used for the conduction inspection. For example, the inspector respectively brings the inspection probes into the two conductive portions p1 and p2 via the two through holes h1 and h2 in the holding piece Q. In this state, the conduction inspection apparatus measures a resistance value between the two inspection probes.

A reference resistance value is previously set in the conduction inspection apparatus. If the measured resistance value is larger than the reference resistance value, it is determined that the two conduction portions p1 and p2 are not electrically connected to each other. On the other hand, if the measured resistance value is the reference resistance value or less, it is determined that the two conduction portions p1 and p2 are electrically connected to each other.

Similarly, the inspector brings the inspection probes into contact with the two conductive portions p1 and p3 via the through holes h1 and h3 of the holding piece Q. In this state, the conduction inspection apparatus measures a resistance value between the two inspection probes. Thus, it is determined whether the two conductive portions p1 and p3 with which the inspection probes are brought into contact are electrically connected to each other.

It is determined whether the error between the position of the outer edge of the support substrate 10 after the etching and the designed position is the defective error or more, i.e., an abnormality occurs in the shape of each of the suspension boards 1 based on a plurality of (two in this example) determination results obtained by the conduction inspection.

The suspension board 1 where no abnormality is determined to occur by the visual inspection and the conduction inspection is determined to be a nondefective product. On the other hand, the suspension board 1 where an abnormality is determined to occur by at least one of the visual inspection and the conduction inspection is determined to be a defective product. The suspension board 1 serving as the defective product is subjected to marking such as punching or inking.

Finally, each of the suspension boards 1 is separated from the support frame FR at the coupling portion J in the assembly sheet 100. At this time, the shape determination unit 2 is separated from each of the suspension boards 1. The suspension board 1 serving as the defective product, which has been subjected to marking, is removed. Thus, the plurality of suspension boards 1 is completed.

(4) Details of Conduction Inspection of Support Substrate

Figure 8:
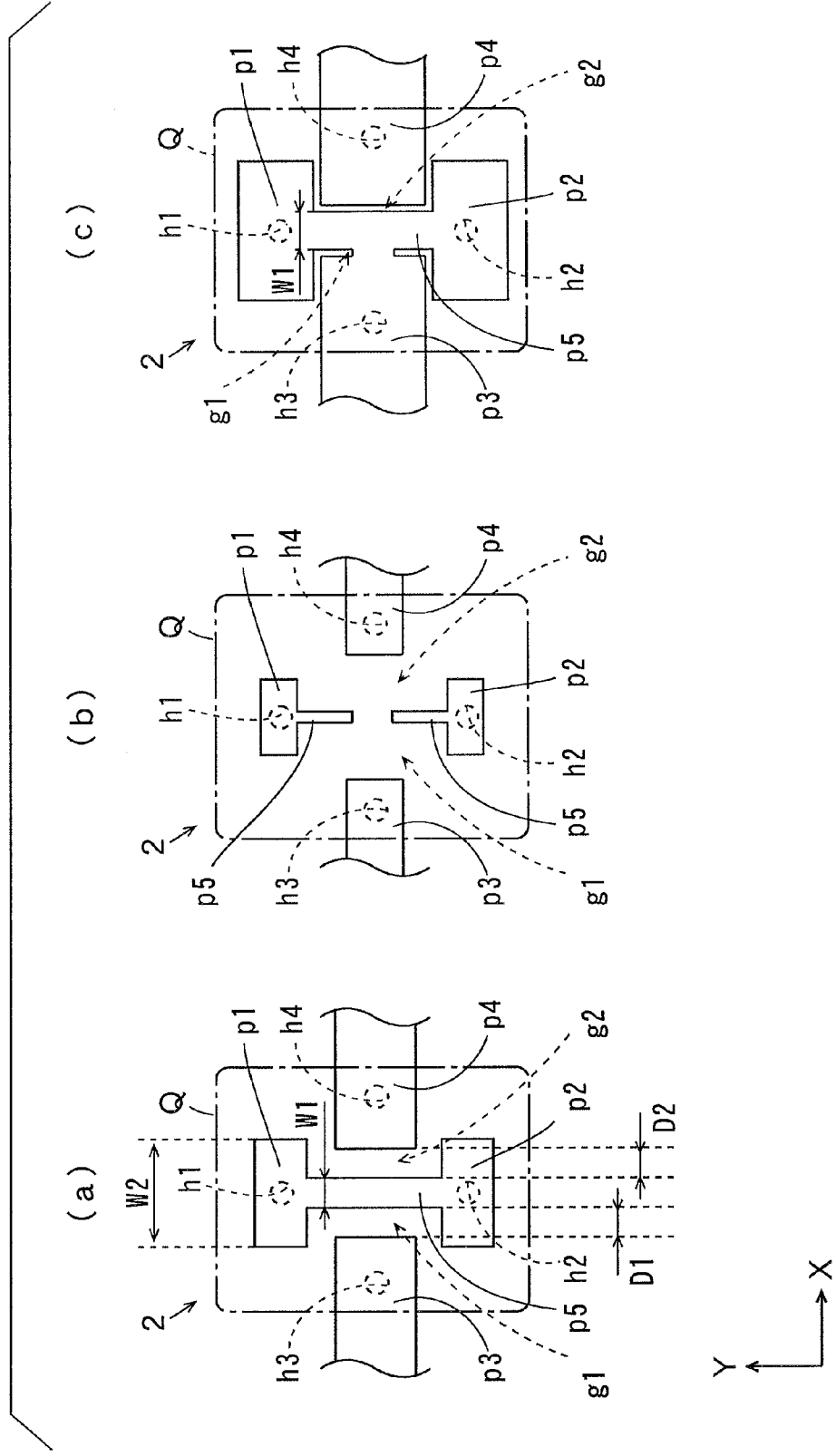
FIG. 8 is a top view of a shape determination unit for illustrating details of conduction inspection of a support substrate.

FIG. 8 is a top view of the shape determination unit 2 for illustrating details of the conduction inspection of the support substrate 10. In FIG. 8, the holding piece Q is indicated by a one-dot and dash line to clearly illustrate the plurality of conductive portions p1 to p5 and the gaps g1 and g2 in the shape determination unit 2.

If the support substrate 10 is etched in a preferable condition, each of positions of outer edges of the plurality of conductive portions p1 to p5 in the shape determination unit 2 matches the designed position, as illustrated in FIG. 8 (*a*). In this case, the conductive portions p1, p2, and p5 are connected to one another on the holding piece Q in the shape determination unit 2. The conductive portion p3 is separated from the conductive portions p1, p2, p4, and p5, and the conductive portion p4 is separated from the conductive portions p1, p2, p3, and p5. Thus, at the time of the conduction inspection of the support substrate 10, it is determined that the conductive portions p1 and p2 are electrically connected to each other, and the conductive portion p1 and a conductive portion p3 are not electrically connected to each other.

If it is thus determined that the conductive portions g1 and g2 are electrically connected to each other and the conductive portions g1 and g3 are not electrically connected to each other, it is determined the error between the position of the outer edge of the support substrate 10 after the etching and the designed position is smaller than the defective error. Thus, it is determined that the suspension board 1 corresponding to the shape determination unit 2 in which the conduction inspection has been performed is a nondefective product.

In the present embodiment, the width W1 of the conductive portion p5 in the shape determination unit 2 is determined to be smaller than the width W2 of the conductive portions p1 and p2 (see FIGS. 4 and 8 (*a*)). When the support substrate 10 is excessively etched, therefore, both ends of the conductive portion p5 between the conductive portions p1 and p2 are separated from each other at its center, for example, as illustrated in FIG. 8 (*b*). In this case, at the time of the conduction inspection of the support substrate 10, it is determined that the conductive portions p1 and p2 are not electrically connected to each other. If it is thus determined that the conductive portions p1 and p2 are not electrically connected to each other, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

On the other hand, if the support substrate 10 is not sufficiently etched, the conductive portions p3 and p5 are not separated from each other, for example, as illustrated in FIG. 8 (*c*). In this case, at the time of the conduction inspection of the support substrate 10, it is determined that the conductive portions p1 and p3 are electrically connected to each other. If it is thus determined that at least the conductive portions p1 and p3 are electrically connected to each other, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

In the above-mentioned example, at the time of the conduction inspection of the support substrate 10, it is determined whether the conductive portions p1 and p2 are electrically connected to each other while it is determined whether the conductive portions p1 and p3 are electrically connected to each other. At the time of the conduction inspection of the support substrate 10, at least one of determination whether the conductive portions p3 and p4 are electrically connected to each other, determination whether the conductive portions p2 and p3 are electrically connected to each other, determination whether the conductive portions p1 and p4 are electrically connected to each other, and determination whether the conductive portions p2 and p4 are electrically connected to each other may be performed.

If it is determined that the conductive portions p3 and p4 are electrically connected to each other, for example, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

If it is determined that the conductive portions p2 and p3 are electrically connected to each other, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

Further, when it is determined that the conductive portions p1 and p4 are electrically connected to each other, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

When it is determined that the conductive portions p2 and p4 are electrically connected to each other, it is determined that the error between the position of the outer edge of the support substrate 10 after the etching and the designed position is the defective error or more. Thus, it is determined that the suspension board 1 corresponding to the shape determination unit 2 in which the conduction inspection has been performed is a defective product.

(5) Dimensions of Conductive Portion

As described above, in the present embodiment, the defective error is the error between the position of the outer edge of the support substrate 10 after the etching and the designed position. Therefore, an amount of etching in which defective etching is considered to occur (a difference between designed dimensions and dimensions after the etching) corresponds to a value that is two times the defective error.

Therefore, the width W1 of the conductive portion p5, the width D1 of the gap g1 in the X direction, and the width D2 of the gap g2 in the X direction, illustrated in FIG. 4, are determined to be equal to the value that is two times the defective error.

If the defective error is 10 μm, the width W1 of the conductive portion p5 and the widths D1 and D2 of the gaps g1 and g2, illustrated in FIG. 4, are respectively set to 20 μm, for example. If the defective error is 15 μm, the width W1 of the conductive portion p5 and the widths D1 and D2 of the gaps g1 and g2, illustrated in FIG. 4, are respectively set to 30 μm, for example. If the defective error is 20 μm, the width W1 of the conductive portion p5 and the widths D1 and D2 of the gaps g1 and g2, illustrated in FIG. 4, are respectively set to 40 μm, for example. If the defective error is 25 μm, the width W1 of the conductive portion p5 and the widths D1 and D2 of the gaps g1 and g2, illustrated in FIG. 4, are respectively set to 50 μm, for example. If the defective error is 30 μm, the width W1 of the conductive portion p5 and the widths D1 and D2 of the gaps g1 and g2, illustrated in FIG. 4, are respectively set to 60 μm, for example.

(6) Effect of Embodiment

In the present embodiment, when the assembly sheet 100 is manufactured, a formation region of the suspension board 1 in the support substrate 10 is etched while a formation region of the shape determination unit 2 in the support substrate 10 is etched. Thus, the plurality of conductive portions p1, p2, p3, p4, and p5 constituting the shape determination unit 2 are formed.

Then, it is determined whether the two conductive portions p1 and p2 are electrically connected to each other to determine whether etching is excessive. In order to determine whether etching is insufficient, it is determined whether at least one of the two conductive portions p1 and p2 and at least one of the two conductive portions p3 and p4 in the shape determination unit 2 illustrated in FIG. 4 are electrically connected to each other. It is determined whether the amount of etching of the support substrate 10 is proper or improper based on determination results of conductive states. As a result, even if a common abnormality occurs in the shapes of the plurality of suspension boards 1, it can be accurately and easily identified whether abnormalities respectively occur in the shapes of the suspension boards 1.

In the assembly sheet 100, each of the shape determination units 2 is arranged in a different region from a region of the corresponding suspension board 1. Thus, the shape determination unit 2 need not be provided in the formation region of the suspension board 1. Therefore, a formation region of the wiring trace can be enlarged in the formation region of the suspension board 1.

(7) Another Example of Configuration of Shape Determination Unit

Figure 9:
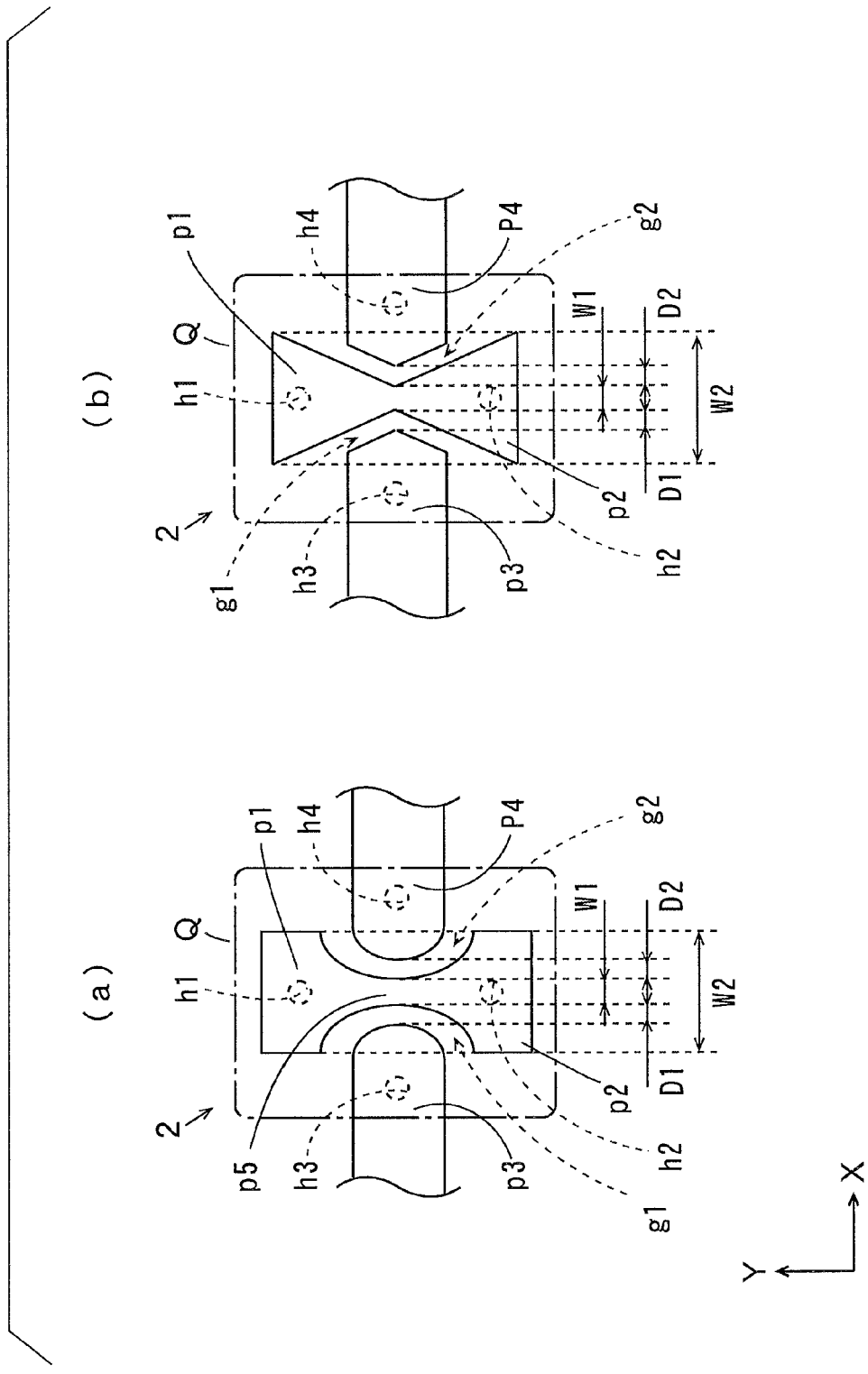
FIG. 9 is a top view illustrating another example of a configuration of the shape determination unit.

Respective shapes of the plurality of conductive portions p1 to p5 in the shape determination unit 2 may be set as follows. FIG. 9 is a top view illustrating another example of a configuration of the shape determination unit 2. In FIG. 9, a holding piece Q is indicated by a one-dot and dash line to clearly illustrate a plurality of conductive portions p1 to p5 and gaps g1 and g2 in the shape determination unit 2.

In an example illustrated in FIG. 9 (a), both sides extending in the Y direction of the conductive portion p5 are curved inward. Thus, the width of the conductive portion p5 gradually decreases from both ends of the conductive portion p5 to the center thereof in the Y direction, and reaches a minimum at the center of the conductive portion p5. In this example, the width at the center of the conductive portion p5 is the width W1 of the conductive portion p5.

Respective tips of the conductive portions p3 and p4 spaced apart from each other in the X direction are curved in a convex shape. The gap g1 extends in the Y direction while being curved between the conductive portion p3 and the conductive portion p5, and the gap g2 extends in the Y direction while being curved between the conductive portion p4 and the conductive portion p5. The width D1 of the gap g1 and the width D2 of the gap g2 are determined to be equal to the width W1 of the conductive portion p5. In this example, the gap g1 has a constant width D1 along its central axis. The gap g2 has a constant width D2 along its central axis.

As described above, the conductive portion p5 is constricted in the Y direction. When a support substrate 10 is etched, an etching rate in a constricted portion is higher than an etching rate in a nonconstricted portion. Therefore, in the shape determination unit 2 illustrated in FIG. 9 (a), when the support substrate 10 is excessively etched, both ends of the conductive portion p5 are easily separated from each other in the constricted portion of the conductive portion p5. Therefore, it can be reliably determined that an abnormality occurs in a shape of a suspension board 1 that has been excessively etched.

In this example, the gaps g1 and g2 extend in the Y direction while being curved. In this case, the lengths of the central axes of the gaps g1 and g2 are respectively larger than the lengths of the central axes of the gaps g1 and g2 illustrated in FIG. 4 extending in a linear shape in the Y direction. When the support substrate 10 is not sufficiently etched, therefore, the conductive portions p3 and p5 are not easily separated from each other, and the conductive portions p4 and p5 are not easily separated from each other. Therefore, it can be reliably determined that an abnormality occurs in a shape of a suspension board 1 that has not been sufficiently etched.

In an example illustrated in FIG. 9 (b), the shape determination unit 2 includes a plurality of conductive portions p1, p2, p3, and p4 and a holding piece Q. Each of the conductive portions p1 and p2 has a shape of a substantially isosceles triangle. Respective base portions of the conductive portions p1 and p2 are parallel to the X direction, and one vertex portion of the conductive portion p1 and one vertex portion of the conductive portion p2 are connected to each other. The width of the conductive portions p1 and p2 reaches a minimum in a coupling portion between the conductive portions p1 and p2. Therefore, in this example, the width of the coupling portion between the conductive portions p1 and p2 is the above-mentioned width W1.

Respective tips of the conductive portions p3 and p4 spaced apart from each other in the X direction have a V shape. The gaps g1 and g2 extend in the Y direction to be folded. The width D1 of the gap g1 and the width D2 of the gap g2 are determined to be equal to the width W1 of the coupling portion between the conductive portions p1 and p2. In this example, the gap g1 has a constant width D1 along its central axis. The gap g2 has a constant width D2 along its center axis.

Thus, in the shape determination unit 2 illustrated in FIG. 9 (b), the coupling portion between the conductive portions p1 and p2 is constricted, as in the shape determination unit 2 illustrated in FIG. 9 (a). Therefore, it can be reliably determined that an abnormality occurs in a shape of a suspension board 1 that has been excessively etched.

The gaps g1 and g2 extend in the Y direction to be folded. In this case, the lengths of the central axes of the gaps g1 and g2 are respectively larger than the lengths of the central axes of the gaps g1 and g2 illustrated in FIG. 4 extending in a linear shape in the Y direction. Therefore, it can be reliably determined that an abnormality occurs in a shape of a suspension board 1 that has not been sufficiently etched.

(8) Another Embodiment

While the shape determination unit 2 is not formed in the support frame FR in the above-mentioned embodiment, the shape determination unit 2 may be formed in the support frame FR.

Figure 10:
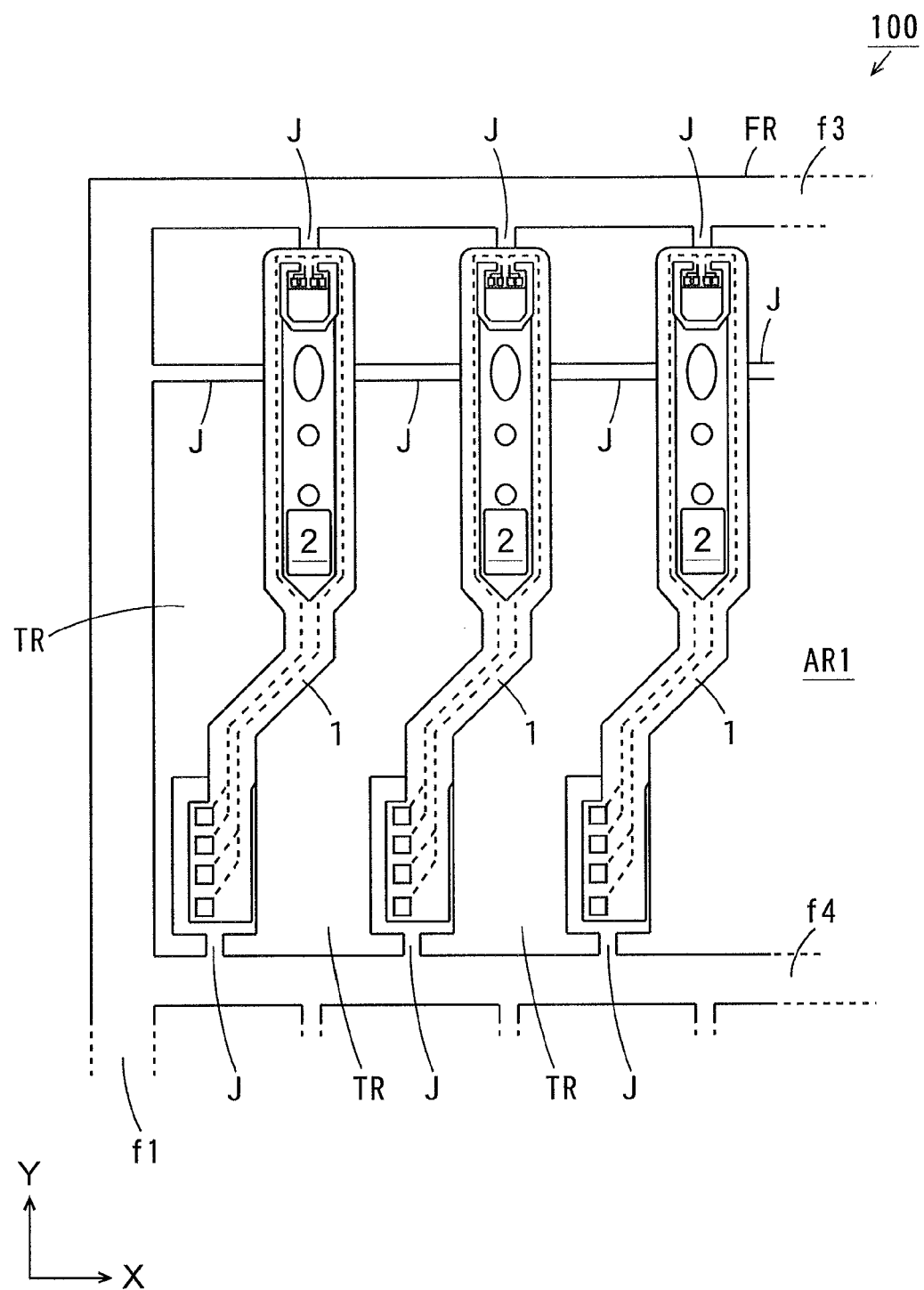
FIG. 10 is a partially enlarged top view illustrating an example of a first arrangement of shape determination units according to another embodiment.

In the above-mentioned embodiment, each of the shape determination units 2 is arranged in a region different from a region of the corresponding suspension board 1 in the assembly sheet 100. The present invention is not limited to this. For example, each of the shape determination units 2 may be arranged in the region of the corresponding suspension board 1. FIG. 10 is a partially enlarged view illustrating an example of a first arrangement of shape determination units 2 according to another embodiment. In an assembly sheet 100 illustrated in FIG. 10, the shape determination unit 2 corresponding to each of suspension boards 1 is arranged in a region of the suspension board 1. In this case, an amount of etching of the support substrate 10 in the shape determination unit 2 and an amount of etching of a support substrate 10 in the suspension board 1 match each other. Therefore, it can be accurately determined whether an abnormality occurs in a shape of each of the suspension boards 1 in the assembly sheet 100.

In the above-mentioned embodiment, in the assembly sheet 100, the plurality of shape determination units 2 respectively correspond to the plurality of suspension boards 1. The present invention is not limited to this. For example, each of the shape determination units 2 may correspond to the plurality of suspension boards 1.

Figure 11:
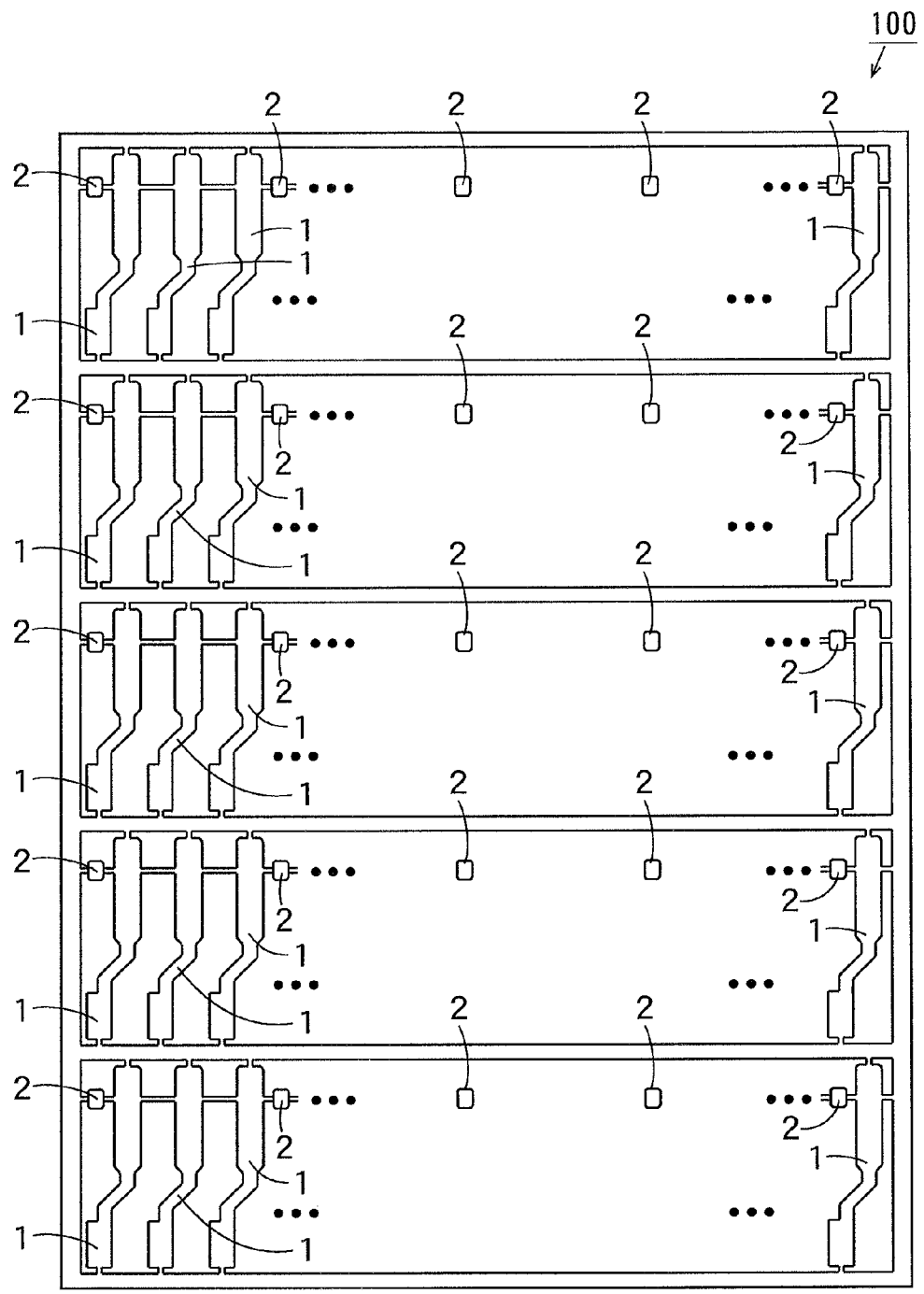
FIG. 11 is a top view illustrating an example of a second arrangement of shape determination units according to another embodiment.

FIG. 11 is a top view illustrating an example of a second arrangement of shape determination units 2 according to another embodiment. In the example illustrated in FIG. 11, 25 shape determination units 2 are equally spaced apart from one another in an assembly sheet 100. In this case, one of the shape determination units 2 determines defective etching of a support substrate 10, for example, so that a plurality of (three in this example) suspension boards 1 in the vicinity of the shape determination unit 2 that has made the determination are determined to be defective products. Thus, a conduction inspection time of the support substrate 10 is shortened.

Figure 12:
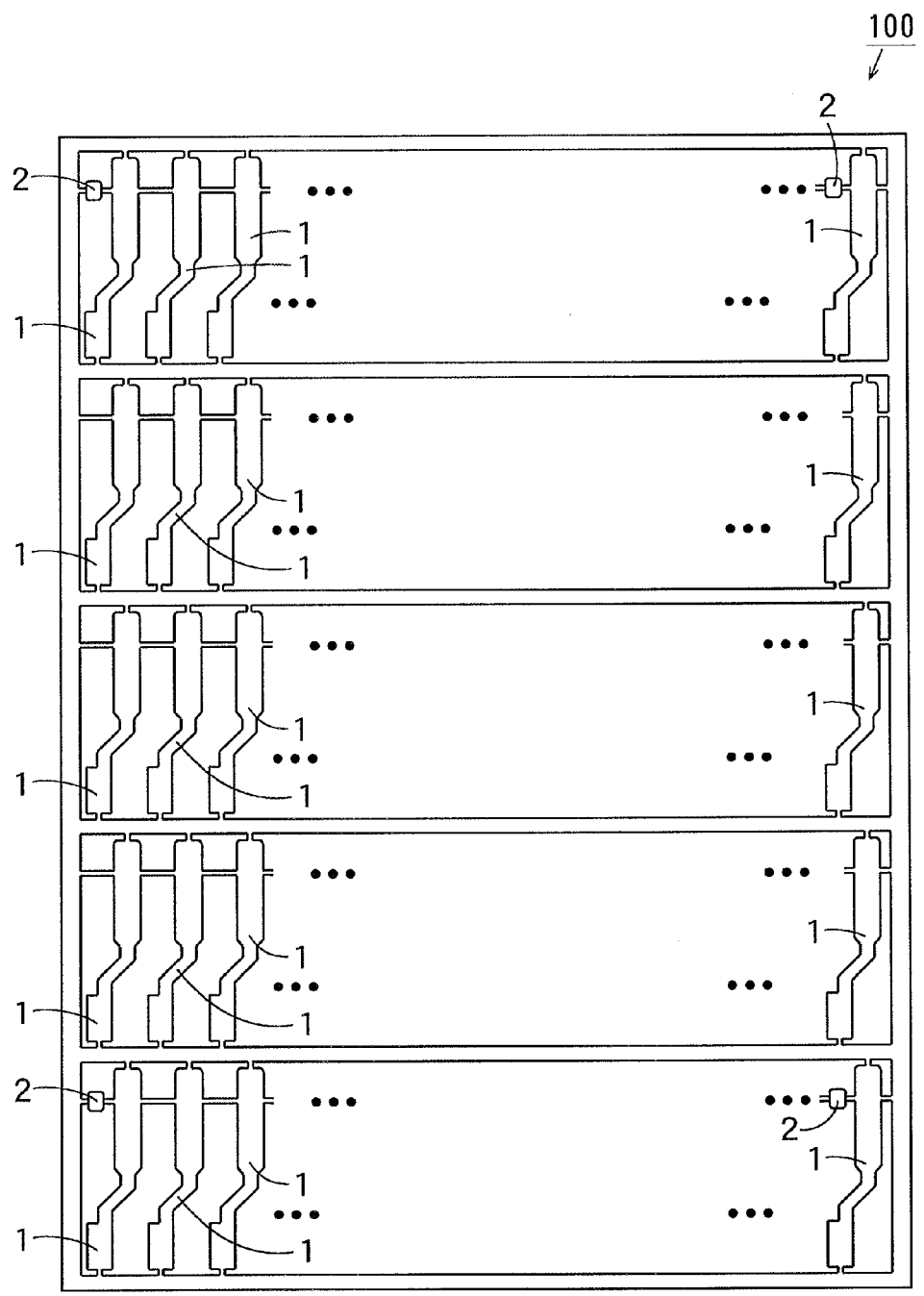
FIG. 12 is a top view illustrating an example of a third arrangement of shape determination units according to another embodiment.

FIG. 12 is a top view illustrating an example of a third arrangement of shape determination units 2 according to another embodiment. In the example illustrated in FIG. 12, the shape determination units 2 are respectively arranged at four corners of an assembly sheet 100. In this case, at least one of the four shape determination units 2 determines defective etching of a support substrate 10, for example, so that all suspension boards 1 in the assembly sheet 100 can be determined to be defective products. Thus, a conduction inspection time of the support substrate 10 is further shortened.

In the above-mentioned embodiment, the holding piece Q may be formed of a cover insulating layer 13 instead of being formed of the base insulating layer 11. The holding piece Q need not necessarily have a rectangular shape, and may have another shape such as a circular shape, an elliptical shape, or a triangular shape, for example.

Although the assembly sheet 100 has a square shape in the above-mentioned embodiment, the present invention is not limited to this. The assembly sheet 100 may have another shape such as an elliptical shape or a triangular shape.

While the printed circuit board assembly sheet is the assembly sheet including the suspension boards with circuits, printed circuit boards in the printed circuit board assembly sheet are not limited to the suspension boards with circuits. For example, the printed circuit board may be another printed circuit board such as a flexible printed circuit board, a substrate for chip on film (COF), and a substrate for tape automated bonding (TAB).

(9) Correspondences Between Elements in the Claims and Parts in Embodiments

In the following paragraphs, non-limiting examples of correspondences between various elements recited in the claims below and those described above with respect to various preferred embodiments of the present invention are explained.

In the above-described embodiments, the support substrate 10 is an example of a support substrate, the first region R1 where the suspension board 1 is formed in the support substrate is an example of a first region, the second region R2 where the shape determination unit 2 is formed in the support substrate 10 is an example of a second region, the base insulating layer 11 is an example of an insulating layer, and the four conductor patterns 12 are examples of a wiring circuit.

A portion of the support substrate 10 constituting the suspension board 1 is an example of a printed circuit board portion, the conductive portions p3 and p4 are examples of a first conductive portion, an assembly of the conductive portions p1, p2, and p5 is an example of a second conductive portion, the suspension board 1 and the assembly sheet 100 are examples of a printed circuit board, and the assembly sheet 100 is an example of a printed circuit board assembly sheet.

Further, the portion having the width W1 of the conductive portion p5 is an example of a portion having a minimum width of a second conductive portion, the width D1 of the gap g1 between the conductive portions p5 and p3 and the width D2 of the gap g2 between the conductive portions p5 and p4 are examples of the minimum distance between the first conductive portion and the second conductive portion.

As each of various elements recited in the claims, various other elements having configurations or functions described in the claims can also be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A printed circuit board comprising: a support substrate having a conductive property; insulating layers respectively formed on first and second regions of said support substrate; and a wiring trace formed on said insulating layer on said first region, wherein said first region of said support substrate is processed into a printed circuit board portion, and said second region of said support substrate is processed into first and second conductive portions spaced apart from each other, and said second conductive portion having a first part defining a first width, a second part, spaced from the first part and defining a second width, and a third part therebetween, having a minimum width smaller than the first width and smaller than the second width; wherein error between a designed position of an edge of the printed circuit board and an actual position of the edge of the printed circuit board is considered to be defective at a predetermined amount, and a minimum distance between said first conductive portion and said second conductive portion and the minimum width of said second conductive portion are each set to a distance that is double the predetermined amount.

2. A printed circuit board assembly sheet having a plurality of printed circuit boards integrally provided therein, comprising: a support substrate having a conductive property; insulating layers respectively formed on a plurality of first regions and a second region of said support substrate; and
- a plurality of wiring traces respectively formed on said insulating layers on said plurality of first regions,
- wherein said plurality of first regions of said support substrate are respectively processed into a plurality of printed circuit board portions, and said second region of said support substrate is processed into first and second conductive portions spaced apart from each other, and said second conductive portion having a first part defining a first width, a second part, spaced from the first part and defining a second width, and a third part therebetween, having a minimum width smaller than the first width and smaller than the second width; wherein error between a designed position of an edge of the printed circuit board and an actual position of the edge of the printed circuit board is considered to be defective at a predetermined amount, and a minimum distance between said first conductive portion and said second conductive portion and the minimum width of said second conductive portion are each set to a distance that is double the predetermined amount.

\* \* \* \* \*